United States Patent [19]

Yagoura et al.

[11] Patent Number: 4,945,391
[45] Date of Patent: Jul. 31, 1990

[54] SEMICONDUCTOR DEVICE HOUSING WITH LASER DIODE AND LIGHT RECEIVING ELEMENT

[75] Inventors: Hideya Yagoura; Isamu Yamamoto, both of Hyogo, Japan

[73] Assignee: Mitsubishi Denki Kabushiki Kaisha, Tokyo, Japan

[21] Appl. No.: 323,660

[22] Filed: Mar. 15, 1989

Related U.S. Application Data

[63] Continuation of Ser. No. 46,358, May 6, 1987, abandoned.

[30] Foreign Application Priority Data

May 6, 1986 [JP] Japan ................................. 61-105316

[51] Int. Cl.$^5$ ............................................. H01L 31/12
[52] U.S. Cl. ........................................ 357/19; 357/74; 357/30; 357/17; 372/36; 372/44
[58] Field of Search .................. 357/19, 74, 30 L, 17; 372/36, 44

[56] References Cited

U.S. PATENT DOCUMENTS 4,338,577  7/1982  Sato et al. .............................. 372/36

FOREIGN PATENT DOCUMENTS

| 12689 | 1/1979 | Japan | 357/19 |
| 118175 | 7/1983 | Japan | 357/19 |
| 25282 | 2/1984 | Japan | 357/19 |
| 75656 | 4/1984 | Japan | 357/19 |
| 121984 | 7/1984 | Japan | 357/19 |
| 81877 | 5/1985 | Japan | 357/19 |
| 130174 | 7/1985 | Japan | 357/19 |

Primary Examiner—William Mintel
Attorney, Agent, or Firm—Sughrue, Mion, Zinn, Macpeak & Seas

[57] ABSTRACT

A semiconductor device includes a laser diode and a light receiving element arranged on a common surface of a substrate and a monitor laser beam from the laser diode is reflected by a reflecting plate to the light receiving element. With the arrangement of the laser diode and the light receiving element on the same surface of the substrate, die-bondings and wire-bondings for the laser diode and the light receiving element can be performed in a single step. Thermal stress due to heat generation of the laser diode is minimized by a use of a sub-mount between the laser diode and the substrate.

3 Claims, 2 Drawing Sheets

SEMICONDUCTOR DEVICE HOUSING WITH LASER DIODE AND LIGHT RECEIVING ELEMENT

This is a continuation of application Ser. No. 07/046,358 filed May 6, 1987 now abandoned.

BACKGROUND OF THE INVENTION

The present invention relates to a semiconductor device including a monitor light receiving element and a laser diode.

Such a semiconductor device is well known and commercially available as exemplified by ML4402 of Mitsubishi Denki Kabushiki Kaisha, HL7831G of Hitachi Ltd., and RLD-78A of Rome Inc., etc.

FIG. 1 is a partially cutaway perspective view of a basic structure of such a semiconductor device and FIGS. 2A and 2B are cross sections taken along lines A—A and B—B in FIG. 1, respectively. In these figures, a laser diode 1 is mounted through a sub-mount 3 on a block 2 bonded onto one surface of a stem 5. A light receiving element 4 is also bonded onto the same surface of the stem 5. Lead pins 6a, 6b and 6c extend from the other surface of the stem 5. The lead pin 6a is connected through a lead wire 7a to the laser diode 1 and the lead pin 6b is connected through a lead wire 7b to the light receiving element 4. A cap 8 having an opening 8a formed at a top thereof is fitted on a peripheral shoulder portion of the stem 5 to protect the laser diode/light receiving element assembly. The opening 8a is closed by a glass plate 9 through which an output laser beam is derived.

The laser diode 1 is disposed such that it can emit a laser beam vertically bidirectionally, an upward component of the laser beam being derived through the opening 8a of the cap 8 as the output laser beam. A downward component is used as a monitor laser beam. The latter is directed to the light receiving element 4 disposed on the stem 5 with a predetermined angle with respect to the latter. The output laser beam is controlled according to the monitor laser beam.

Since an operation of the laser diode 1 becomes unstable due to heat generated by the operation thereof, the block 2 is made of a high thermal conductivity material such as metal so that such heat is easily dissipated. Further, the sub-mount 3 disposed, between the laser diode 1 and the block 2 of, for example, silicon serves to eliminate a possible displacement of the laser diode 1 with respect to the block 2 due to a difference in thermal expansion therebetween.

The manufacture of such a semiconductor device includes a step of die-bonding the light receiving element 4 onto the stem 5 and then wire-bonding the lead wire 7b thereto, a step of bonding the laser diode 1 onto the block through the sub-mount 3 and then wire-bonding the lead wire 7a and a step of mounting the cap 8. That is, the die-bondings and wire-bondings are performed separately for the laser diode and the light receiving element.

Such separate bonding steps for the laser diode and the light receiving element causes the productivity of the semiconductor device to be low and the cost therefor to be high.

SUMMARY OF THE INVENTION

An object of the present invention is to provide a semiconductor device which is inexpensive to manufacture and in which the productivity thereof is much improved.

According to the present invention, a semiconductor device is featured wherein a monitor laser beam from a laser diode is reflected by a reflecting plate and directed to a light receiving element. Therefore, it is possible to arrange the laser diode and the light receiving element on one and the same surface of a substrate, by which the bondings for the laser diode and the light receiving element can be performed at once.

DETAILED DESCRIPTION OF THE PREFERRED EMBODIMENTS

Figure 1:
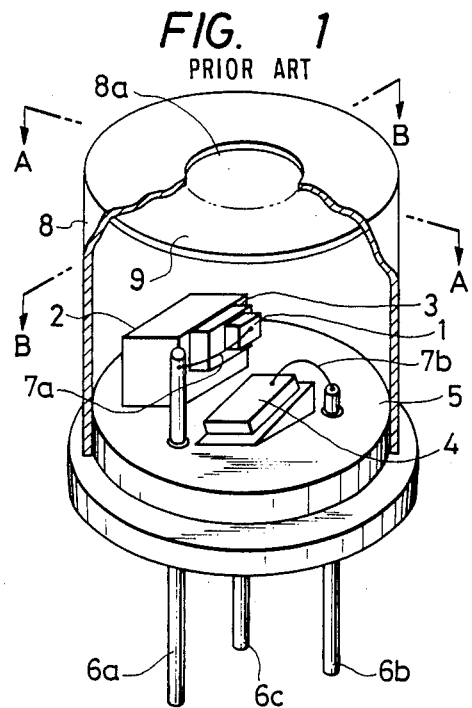
FIG. 1 is a partially cutaway perspective view of a conventional semiconductor device, showing a basic construction thereof.
Figure 2A:
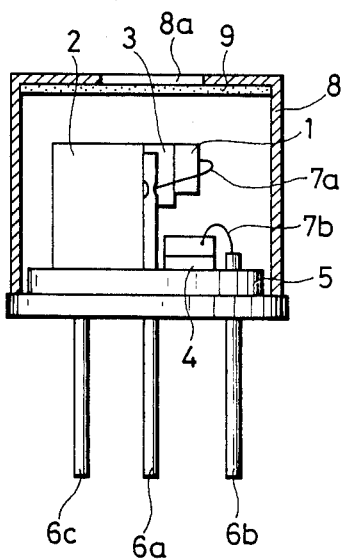
FIG. 2A is a cross section taken along a line A—A in FIG. 1.
Figure 2B:
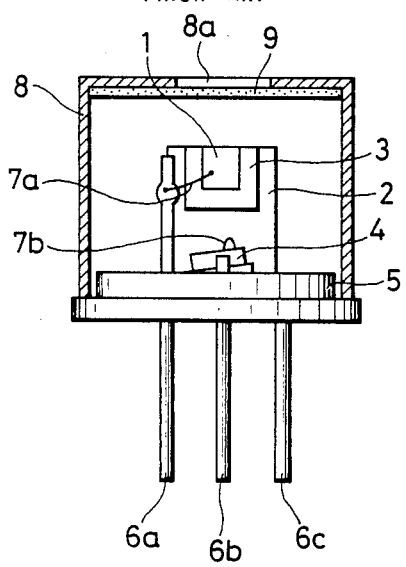
FIG. 2B is a cross section taken along a line B—B in FIG. 1.
Figure 3:
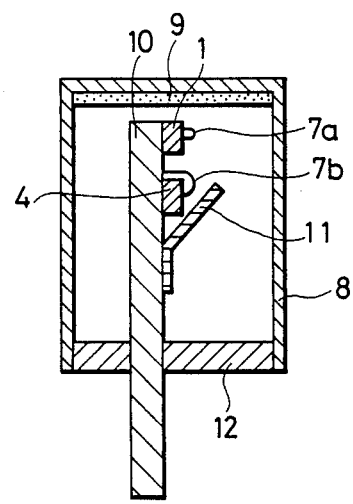
FIG. 3 is a cross section of a semiconductor device according to the present invention.

In FIG. 3 in which same reference numerals are used to depict same or corresponding elements as those in FIG. 1, respectively, a reflecting plate 11 is bent to form a portion to be attached to a substrate 10 formed of a high thermal conductivity material such as SiC or AlN, or a metal based substrate etc. A laser diode 1 and a light receiving element 4 are mounted directly on the substrate 10 on the same side as that to which reflecting plate 11 is attached. The laser diode/light receiving element/reflecting plate assembly is disposed in a protective cap 8, with a lower portion of the substrate 10 extending through a sealing member 12 for sealing a lower opening of the cap 8. The sealing member 12 may be of a suitable resin.

Figure 5A:
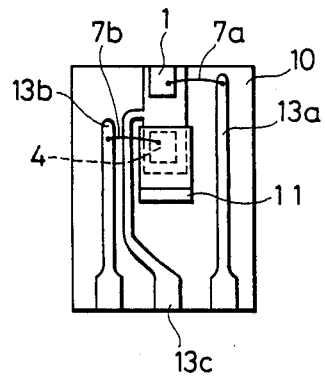
FIG. 5A is a front view of a main portion of another embodiment of the present invention.
Figure 5B:
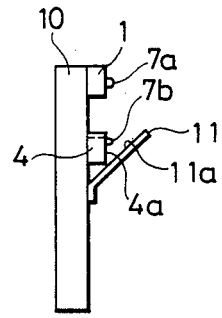
FIG. 5B is a side view of the embodiment in FIG. 5A.

FIGS. 5A and 5B are a front and a side views of a main portion of the semiconductor device shown in FIG. 3, showing details of mountings of the laser diode 1, the light receiving element 4 and the reflecting plate 11 onto the substrate 10. As shown, these elements are mounted on the same surface of the substrate 10. The laser diode 1 is disposed such that it emits a laser beam vertically bidirectionally and the light receiving element 4 is disposed on the side of the laser diode 1 from which a monitor laser beam is emitted. A light receiving surface 4a of the light receiving element 4 faces forward the reflecting plate 11 disposed with a predetermined angle with respect to the surface of the substrate 10. The angle is selected such that the downwardly directed, monitor laser beam is reflected by the reflecting plate 11 and impinges on the light receiving surface 4a of the light receiving element 4.

On the same surface of the substrate 10, wiring patterns 13a to 13c are formed. The laser diode 1 is connected through a lead wire 7a to the wiring pattern 13a and the light receiving element 4 is connected through a lead wire 7b to the wiring pattern 13b.

Figure 4:
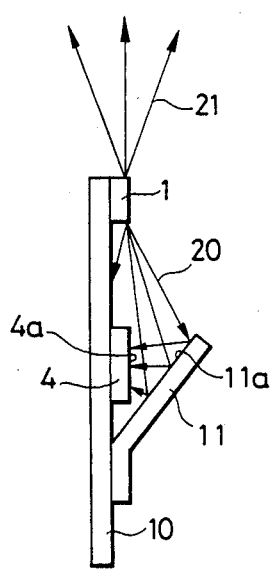
FIG. 4 is a side view of a main portion of the semiconductor device in FIG. 3, showing laser beam paths.

FIG. 4 shows optical paths of laser beams in the semiconductor device shown in FIG. 3. A laser beam emitted from the laser diode 1 in either direction covers a radiation angle of about 20° to 45° and the reflecting plate 11 reflects a monitor laser beam 20 incident on the reflecting surface 11a thereof to a light receiving surface 4a of the light receiving element 4. An output laser beam 21 is controlled on the basis of the monitor laser beam 20 detected by the light receiving element 4. In order to control the laser diode 1 on the basis of monitoring of the light receiving element 4, a monitor current Im of the light receiving element 4 should be about 0.2 mA or more. The value of Im depends upon a length L of an optical path from the laser diode 1 to the light receiving element 4 or a light receiving area of the light receiving element and examples of the optical path length L for various light receiving areas of the light receiving element 4 which satisfy the Im condition are shown in the following table.

TABLE I

| Optical path length L(mm) satisfying Im = 0.2 mA | | |
|---|---|---|
| Size of light receiving element | 0.75 mm² | 1.2 mm² |
| Optical Output 3 mW | 3.5 | 5 |
| Optical Output 5 mW | 5 | 7 |

Thus, by changing the length L and/or the light receiving area of the light receiving element, it is possible to monitor the output laser beam correctly.

The laser diode 1 is heated during its operation. However, since the substrate 10 is formed of the high thermal conductivity material such as SiC, etc., such heat is easily radiated. Further, since its coefficient of linear expansion is nearly equal to that of the laser diode 1, a thermal stress acting on the laser diode 1 is minimized.

In manufacturing the semiconductor device constructed as above, the die-bonding and the wire-bonding operations for the laser diode 1 and the light receiving element 4 arranged on the same surface of the substrate 10 are performed in a single step. That is, by regulating the light path of the monitor laser beam 20 by means of the reflecting plate 11, it is possible to arrange the laser diode 1 and the light receiving element 4 on the same surface of the substrate 10. Thus, it is possible to perform the die-bondings and the wire bondings for these elements simultaneously, resulting in a minimized number of manufacturing steps and thereby improved productivity and minimized manufacturing cost.

In this embodiment of the present invention, the laser diode 1 and the light receiving element 4 are arranged on the same surface of the substrate 10, directly.

Figure 6:
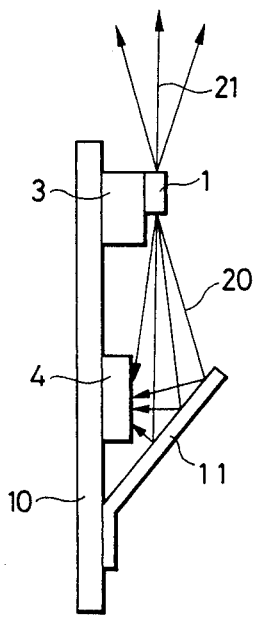
FIG. 6 is a side view of a main portion of a further embodiment of the present invention.

In another embodiment shown in FIG. 6, the laser diode 1 is mounted on the surface of the substrate 10 indirectly through a sub-mount 3. With this structure, when a material of the sub-mount 3 is selected suitably, it is possible to minimize thermal stress due to a difference in the thermal expansion coefficient between the laser diode 1 and the substrate 10 and thus to improve the reliability of monitoring on the side of the light receiving element 4.

According to the semiconductor device of the present invention, the component of the laser beam from the laser diode which is used to monitor the output laser beam is guided by the reflecting plate 11 to the light receiving element 4. Therefore, it is possible to arrange the laser diode and the light receiving element on the same side of the substrate and thus to perform the die bondings and the wire bondings therefor in a single step, resulting in improved productivity and minimized manufacturing cost.

What is claimed is:

1. A semiconductor device, comprising: a planar substrate (10), a laser diode (1) disposed on one surface of said substrate for simultaneously emitting both a first, output laser beam (21) in a first direction parallel to said substrate and a second, monitor laser beam (20) in a second direction opposite to said first direction and parallel to said substrate, a light receiving element (4) disposed on said one surface of the substrate, spaced from the laser diode, and having a light receiving surface (4a) parallel to said substrate, a plurality of wiring patterns (13a, 13b, 13c) disposed on said one surface of the substrate wherein said laser diode and said light receiving element are each connected through a lead wire to a corresponding one of said wiring patterns, and a flat plate (11) mounted on said one surface of the substrate and having a reflecting surface (11a) disposed in the path of said monitor laser beam and oriented to reflect said monitor laser beam onto the light receiving surface of said light receiving element, said plate being disposed at an acute angle to said one surface of the substrate.

2. The semiconductor device as claimed in 1, wherein said substrate is formed of a high thermal conductivity material selected from the group consisting of SiC, AlN and a metal based material.

3. The semiconductor device as claimed in claim 1, further comprising a sub-mount (2) arranged between said laser diode and said substrate, said sub-mount being made of a material having a coefficient of thermal expansion substantially similar to those of said laser diode and said substrate to minimize thermal stress produced by heat generation in said laser diode.

* * * * *